(12) United States Patent
Andrews

(10) Patent No.: US 8,410,512 B2
(45) Date of Patent: Apr. 2, 2013

(54) SOLID STATE LIGHT EMITTING APPARATUS WITH THERMAL MANAGEMENT STRUCTURES AND METHODS OF MANUFACTURING

(75) Inventor: Peter S. Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 444 days.

(21) Appl. No.: 12/625,943

(22) Filed: Nov. 25, 2009

(65) Prior Publication Data

US 2011/0121333 A1    May 26, 2011

(51) Int. Cl.
*H01L 33/00* (2010.01)
*H01L 21/00* (2006.01)

(52) U.S. Cl. .............. 257/99; 257/98; 257/100; 257/81; 257/82; 257/83; 257/84; 257/85; 438/26

(58) Field of Classification Search ............. 257/98, 257/989, 100, 81–85, 99; 438/26
See application file for complete search history.

(56) References Cited

U.S. PATENT DOCUMENTS

| | | | | |
|---|---|---|---|---|
| 5,506,755 | A * | 4/1996 | Miyagi et al. ................. | 361/720 |
| 5,659,458 | A * | 8/1997 | Patchen ........................ | 361/704 |
| 6,274,924 | B1 | 8/2001 | Carey et al. | |
| 6,335,548 | B1 | 1/2002 | Roberts et al. | |
| 6,521,916 | B2 | 2/2003 | Roberts et al. | |
| 6,799,864 | B2 * | 10/2004 | Bohler et al. ................. | 362/236 |
| 6,897,486 | B2 | 5/2005 | Loh | |
| 2001/0048536 | A1 * | 12/2001 | Lehmann et al. ............ | 358/513 |
| 2002/0021871 | A1 * | 2/2002 | Auburger et al. ............. | 385/88 |
| 2003/0007753 | A1 * | 1/2003 | Hurt et al. ...................... | 385/92 |
| 2005/0094949 | A1 * | 5/2005 | Mink .............................. | 385/92 |
| 2006/0007661 | A1 * | 1/2006 | Iketaki ........................ | 361/719 |
| 2008/0023825 | A1 * | 1/2008 | Hebert et al. ................. | 257/724 |
| 2008/0099770 | A1 * | 5/2008 | Mendendorp et al. ......... | 257/79 |
| 2008/0123340 | A1 | 5/2008 | McClellan | |
| 2008/0191237 | A1 * | 8/2008 | Andrews ....................... | 257/100 |
| 2009/0097249 | A1 * | 4/2009 | Lee et al. ................. | 362/249.02 |
| 2009/0185350 | A1 * | 7/2009 | Grajcar ........................ | 361/704 |

* cited by examiner

*Primary Examiner* — Fernando L Toledo
*Assistant Examiner* — Karen Kusumakar
(74) *Attorney, Agent, or Firm* — Myers Bigel Sibley & Sajovec

(57) ABSTRACT

Provided are apparatus and methods corresponding to a solid state light emitting element. Such methods include mounting, to a thermally conductive component, a solid state light emitting element that includes first and second electrical connection points that are configured to be conductively engaged on a first side of a circuit structure. The solid state light emitting element is electrically insulated from the thermally conductive component to provide that electrical connections are arranged on the first side of the circuit structure and heat is conducted to a second side of the circuit structure that is opposite the first side of the circuit structure.

17 Claims, 5 Drawing Sheets

SOLID STATE LIGHT EMITTING APPARATUS WITH THERMAL MANAGEMENT STRUCTURES AND METHODS OF MANUFACTURING

FIELD OF THE INVENTION

This invention relates to solid state light emitting apparatus, and more particularly to packaging techniques and methods for solid state light emitting apparatus.

BACKGROUND OF THE INVENTION

Solid state light emitting apparatus are being widely designed and marketed as replacements for conventional incandescent lighting apparatus and/or other conventional lighting applications. Solid state light emitting apparatus can include solid state flashlights, spotlights, searchlights, headlights, pixels for arena displays, recessed lighting, light fixtures and/or other solid state lighting devices. Such solid state light emitting apparatus may generally include a mounting substrate and a plurality of solid state light emitting elements, such as Light Emitting Diodes (LEDs), on the mounting substrate. A housing may be configured for mounting the substrate therein. Optical elements, such as lenses, solid state light emitting element drivers and/or other support circuitry and/or a power source, such as a battery power supply and/or connections for an alternating current (AC)/direct current (DC) power supply, also may be provided. The solid state light emitting elements themselves may provide the appearance of white light, colored light and/or any other narrow or wideband light spectrum.

Although solid state light emitting elements, such as LEDs, may be more efficient than conventional incandescent light bulbs, the LEDs may still generate substantial heat under operating conditions, which may degrade device performance and/or reliability. Accordingly, when multiple LEDs are placed on a mounting substrate to provide a light emitting apparatus, thermal management techniques may be desired to dissipate heat and to maintain LED performance/reliability. Conventional techniques for thermal management may include mounting LEDs on thermally conductive media and/or the use of heat sinks. However, these techniques may require specialized electrical interfaces, such as specialized printed circuit boards (PCBs), which may result in undesirable additional productions/integration expense.

SUMMARY OF THE INVENTION

The Summary will correspond to the final state of the claims.

DETAILED DESCRIPTION

Figure 1A:
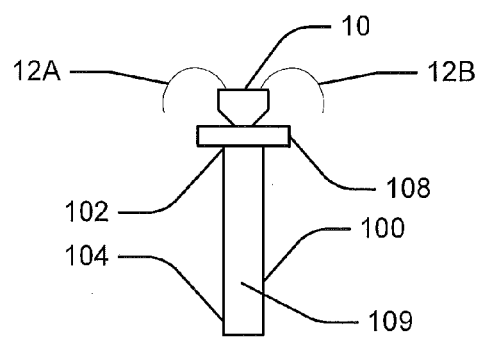
FIGS. 1A-1D are each a side cross-sectional view of different respective embodiments of a solid state light emitting apparatus having a solid state light emitting element according to various embodiments of the invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "included," "including," "have" and/or "having" when used in this specification, specify the presence of stated features, regions, steps, operations, elements, and/or components, but do not preclude the presence or addition of one or more other features, regions, steps, operations, elements, components, and/or groups thereof.

It will be understood that when an element, such as a layer or region, is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section.

Furthermore, relative terms, such as "lower", "base", or "horizontal", and "upper", "top", or "vertical" may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1A-1D are each a side cross-sectional view of different respective embodiments of a solid state light emitting apparatus having one solid state light emitting element according to various embodiments of the invention. Referring to FIG. 1A, a solid state light emitting element (emitter) 10 includes first and second electrically conducting emitter connection portions 12A, 12B across which a voltage may be applied to activate the emitter 10. The first and second electrically conducting emitter portions 12A, 12B may be configured to be coupled to electrical termination surfaces on a first side of a circuit structure (not shown here). Some embodiments provide that a reflective component (not shown) is arranged proximate the emitter 10 to reflect light that is emitted from the emitter 10.

Some embodiments include a thermally conductive component 100 that is configured to conduct heat that is generated by the emitter 10 from a proximal end 102 that is proximate the emitter 10 on the first side of the circuit structure to a distal end 104 that is on a second side of the circuit structure. For example, some embodiments provide that the thermally conductive component is a thermally conductive post. In some embodiments, the thermally conductive component 100 includes a head portion 108 corresponding to the proximal end 102 and including a first diameter. The thermally conductive component 100 may include a shaft portion 109 that includes a second diameter that is less than the first diameter. In some embodiments, the thermally conductive component 100 may include a shaft portion 109 that includes a shaft diameter that is equal to and/or greater than the first shaft diameter. The thermally conductive component 100 may include thermally conductive materials including metallic and/or non-metallic materials such as, aluminum and/or copper, among others. The thermally conductive component 100 may include a wire having a round, rectangular, square, X-shaped and/or H-shaped cross-sectional shape.

Figure 1B:
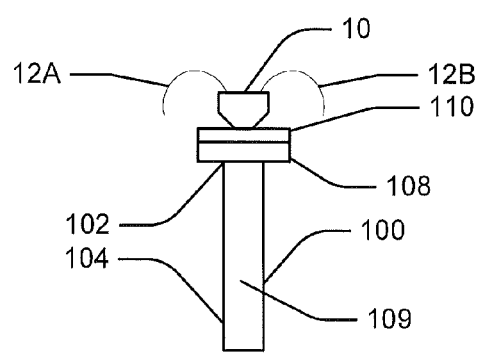

Referring to FIG. 1B, the solid state light emitting apparatus may include an electrically insulating layer 110 between the proximate end 102 of the thermally conductive component 100 and the emitter 10. In some embodiments, the electrically insulating layer 110 is on the head portion 108 of the thermally conductive component 100. The electrically insulating layer 110 may include electrically non-insulating materials such as plastics, polymers, and/or oxides, among others.

Figure 1C:
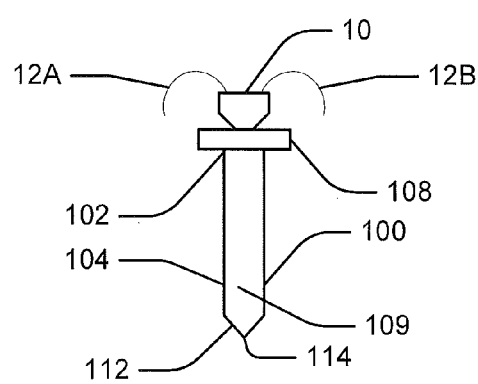

Referring to FIG. 1C, some embodiments of the thermally conductive component 100 include a tapered portion 112 at the distal end 104. The tapered portion 112 may be configured to form a substantially pointed end 114. In some embodiments, the tapered portion 112 may be provided over a substantial portion of the length of the shaft portion 109 or may be localized to be substantially proximate the distal end 104. In some embodiments, the pointed end 114 may be configured to punch through one or more films, tapes and/or insulating materials used in manufacturing a lighting apparatus. Some embodiments provide that the tapered portion 112/pointed end 114 may be used to displace thermal grease and/or epoxy that may be positioned on the second side of the circuit structure.

Figure 1D:
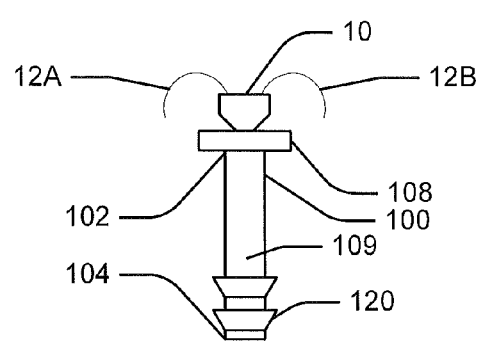

As illustrated in FIG. 1D, the thermally conductive component 100 may include one or more mechanical engagement structures 120 that are configured to mechanically engage a heat dissipating component (not shown here) that is on the second side of the circuit structure.

Figure 2A:
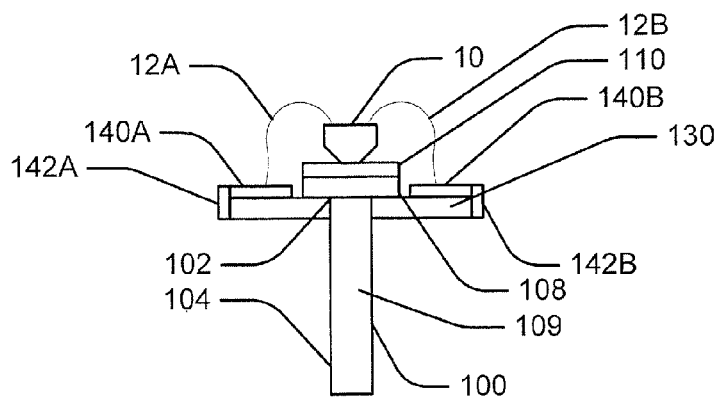
FIGS. 2A-2B are each a partial side cross-sectional view of different respective embodiments of a solid state light emitting apparatus in a submount according to some embodiments of the invention.
Figure 2B:
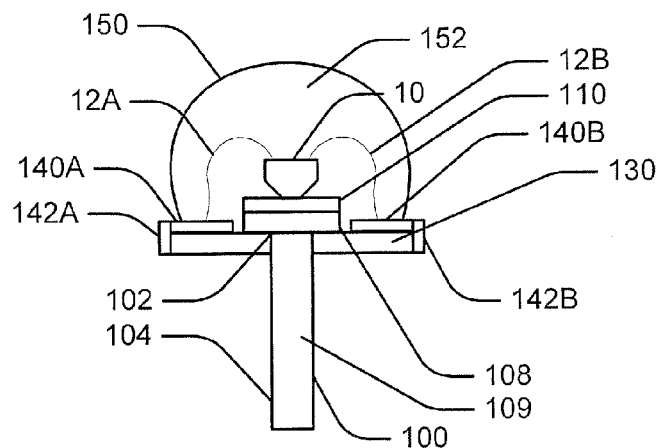

Reference is now made to FIGS. 2A-2B, which are each a partial side cross-sectional view of different respective embodiments of a solid state light emitting apparatus in a submount according to some embodiments of the invention. Some embodiments include features and/or components that are described above, the discussion of which may be omitted hereafter. Referring to FIG. 2A, the proximal end 102 of the thermally conductive component may be engaged by an electrically insulating submount 130. For example, in embodiments including a head portion 108, the distal end 104 of the thermally conductive component 100 may be received by a hole in the electrically insulating submount 130 to the extent that the head portion 108 becomes substantially adjacent the electrically insulating submount 130. The electrically insulating submount 130 may include a material such as, for example, one or more plastics, polymers, and/or ceramics, among others. Some embodiments may include first and second electrically conducting components 140A, 140B on the electrically insulating submount 130. The first and second electrically conducting components 140A, 140B may be attached to, mounted on and/or arranged on the electrically insulating submount 130 and may conductively couple the first and second electrically conducting emitter connection portions 12A, 12B to respective electrical termination surfaces on a first side of a circuit structure (not shown here).

In some embodiments, the first and second electrically conducting components 140A, 140B may be electrically connected to the circuit structure via additional castellations 142A, 142B. For example, the electrically insulating submount 130 may include a ceramic panel with castellations 142A, 142B for attaching using surface mount technology. Some embodiments provide that a leadframe may be used as part of the connecting circuit structure and that 142A, 142B may include leadframe leads, which may also be referred to as legs. In some embodiments, a combination of vertical leadframe technology for the heat conduction element and flat leadframe technology for the electrical circuit connections may be combined to form an emitter.

Reference is now made to FIG. 2B, which further includes an encapsulating portion 150 that is formed around the emitter 10. The encapsulating portion 150 may enclose the proximal end 102 of the thermally conductive component 100, the first and second electrically conducting emitter connection portions 12A, 12B and/or portions of the first and second electrically conducting components 140A, 140B. In some embodiments, the encapsulating portion 150 may include optical-property modifying particles and/or materials 152 that may be suspended in and/or captured by the encapsulating portion 150. The optical-property modifying particles and/or materials 152 may include, reflective particles, light conversion particles, and/or light filtering particles, among others.

Figure 3:
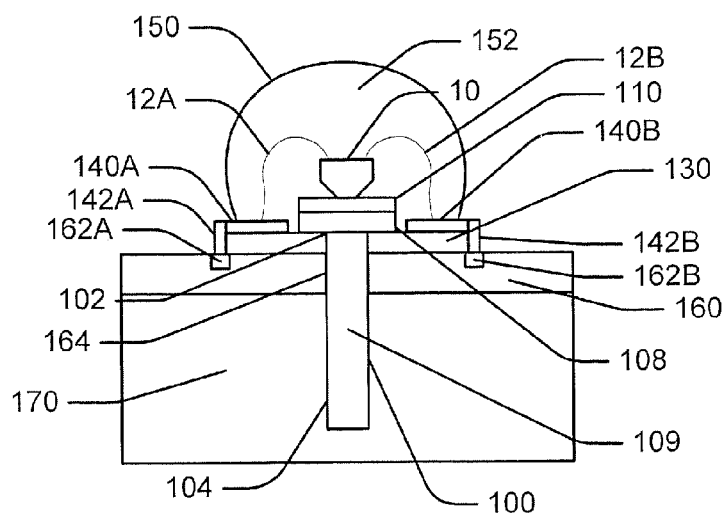
FIG. 3 is a partial, side cross-sectional view of a solid state light emitting apparatus in a circuit structure according to some embodiments of the invention.

Reference is now made to FIG. 3, which is a partial, a side cross-sectional view of a solid state light emitting apparatus in a circuit structure according to some embodiments of the invention. As illustrated, FIG. 3 may include various features described above, the subsequent discussion of which may be omitted. A circuit structure 160 may include a hole 164 that is configured to receive the thermally conductive component 100 from a first (top) side of the circuit structure 160 such that the proximal end 102 is adjacent the first side and the distal end 104 extends beyond a second (bottom) side of the circuit structure 160 that is opposite the first side.

The circuit structure 160 may include first and second electrical contacts 162A, 162B that are configured to conductively engage the castellations 142A, 142B and/or the first and second electrically conducting components 140A, 140B that are on the insulating submount 130. The first and second electrical contacts 162A, 162B may be positioned on the first side of the circuit structure 160 and may include mating contacts corresponding to leadframe and/or surface mount technology contacts, among others. As the thermally conducting component 100 extends through the circuit structure to the second side thereof, the heat generated by the emitter 10 may be transferred to the second side of the circuit structure 160 while the electrical terminations may be performed on the first side of the circuit structure 160. The circuit structure 160 may include a printed circuit board (PCB), a printed wiring assembly, a flex-print wiring board and/or any other type of similarly configured circuit structure that is not specifically designed to address thermal dissipation issues.

Some embodiments provide that the distal end 104 of the thermally conductive component 100 is engaged with a heat dissipating component and/or substance 170. The heat dissipating component and/or substance 170 may include a heat sink, thermal grease, and/or thermal epoxy, among others. For example, in the case of thermal grease and/or thermal epoxy, the distal end 104 of the thermally conductive component 100 may be configured to displace the thermal grease and/or thermal epoxy when the thermally conductive component 100 is received by the circuit structure hole 164. The thermally conductive component 100 may be configured to engage the heat dissipating component and/or substance 170 via solder, an adhesive compound, a thermal grease, friction, a mechanical compression fastening technique, crimp, and/or clamp, among others. In this manner, the circuit structure 160 may provide conventional electrical termination features on the first side and the thermal management features, if any, on the second side.

Some embodiments provide that the heat dissipating component and/or substance 170 may include heat fins or the like and may include and/or utilize screw and/or bolt holes, among others, to increase self-sufficiency in the context of thermal management (e.g., power/heat dissipation.) In some embodiments, wires may be molded into the circuit structure 160 such that a stand-alone light emitting apparatus may be provided that may only require electrical termination to an appropriate electrical supply.

Figure 4:
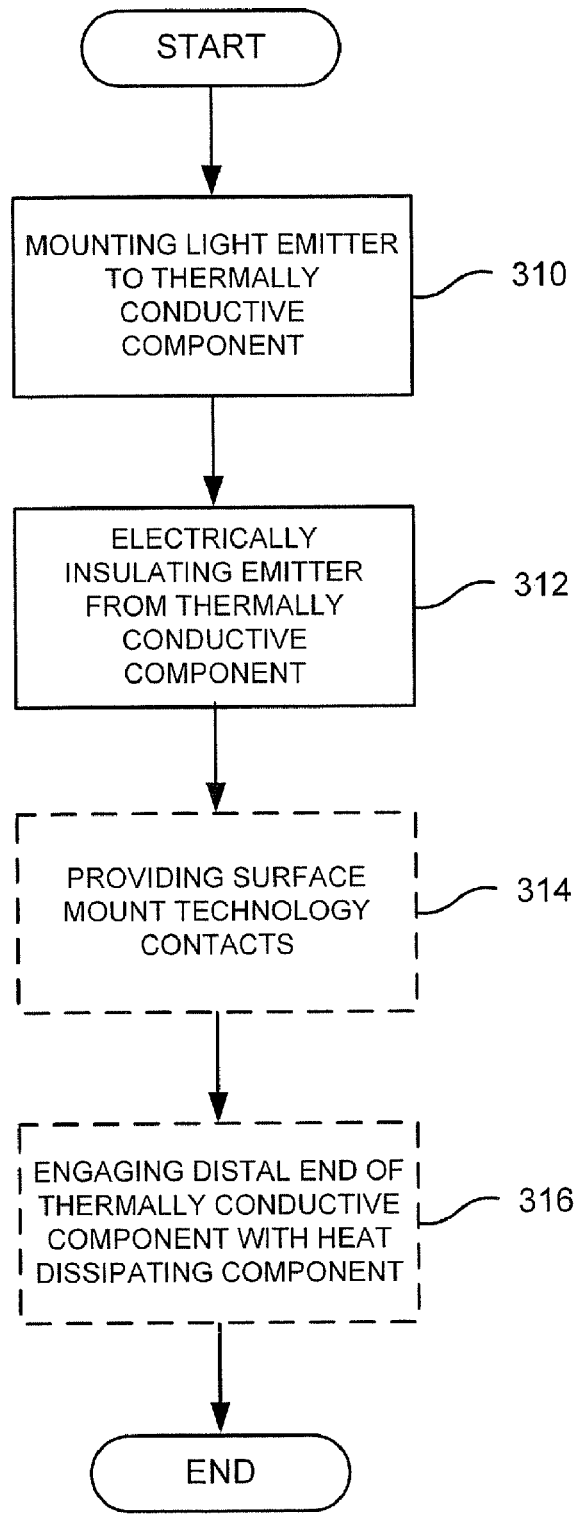
FIG. 4 is a block diagram illustrating operations for packaging a solid state light emitting element according to some embodiments of the invention.

Reference is now made to FIG. 4, which is a block diagram illustrating operations for packaging a solid state light emitting element according to some embodiments of the invention. A solid state light emitting element may be mounted to a thermally conductive component (block 310). The solid state light emitting element may include first and second electrical connection points that are configured to be conductively engaged on a first side of a circuit structure.

The solid state light emitting element may be electrically insulated from the thermally conductive component to provide that electrical connections are arranged on the first side of the circuit structure and that heat is transferred to a second side of the circuit structure that is opposite the first side of the circuit structure (block 312). In this manner, circuit structures that are configured to use conventional electrical termination techniques may be used with the solid state light emitting elements without having to provide specific thermal management features thereon.

In some optional embodiments, surface mount technology (SMT) contacts may be provided and may correspond to the first and second electrical connection points (block 314). The SMT contacts may be configured to conductively engage mating contacts on the first side of the circuit structure. Some embodiments provide that the circuit structure may include leadframe technology electrical contacts.

Some embodiments may optionally provide that a distal end of the thermally conductive component is engaged with a heat dissipating component that is positioned on the second side of the circuit structure (block 316). The heat dissipating component may include a heat sink, thermal grease, and/or thermal epoxy, among others. The thermally conductive component may engage the heat dissipating component via solder, an adhesive compound, a thermal grease, friction, a mechanical compression fastening technique, crimp, and/or clamp, among others. In this manner, the circuit structure may provide electrical termination features on the first side and the thermal management features, if any, on the second side.

Figure 5:
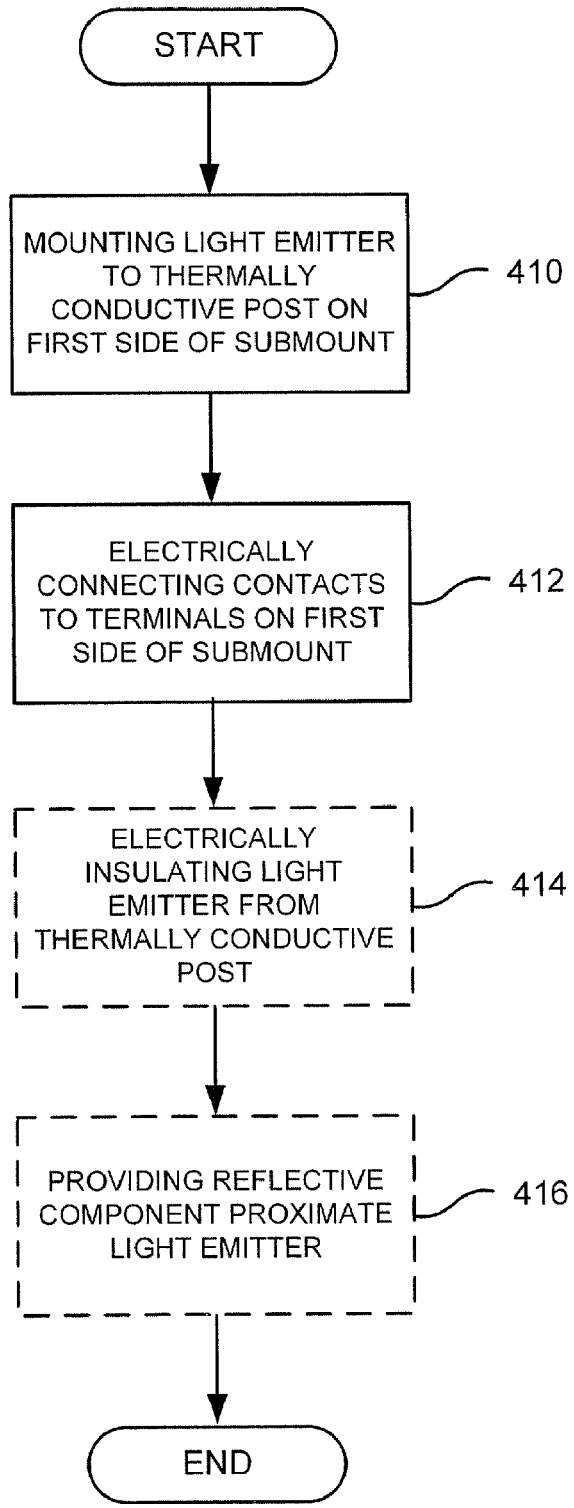
FIG. 5 is a block diagram illustrating operations for assembling a light emitting apparatus according to some embodiments of the invention.

Reference is now made to FIG. 5, which is a block diagram illustrating operations for assembling a light emitting apparatus according to some embodiments of the invention. A solid state light emitting element is mounted on a proximal end of a thermally conductive post that is configured to be adjacent a first side of an electrically insulating submount (block 410). The insulating submount may include a hole that is configured to receive the thermally conductive post. For example, a distal end of the thermally conductive post may be inserted into the submount hole until the proximal end of the thermally conductive post is adjacent the first side of the electrically insulating submount.

First and second contacts of the solid state light emitting element may be electrically connected to first and second terminals that are on the first side of the electrically insulating submount (block 412). The electrically insulating submount may include a second side that is opposite the first side and through which the thermally conductive post protrudes to transfer heat from the first side of the electrically insulating submount to the second side. In some embodiments, the solid state light emitting element may be electrically insulated from the thermally conductive post via a dielectric layer that is formed on a top surface of the thermally conductive post (block 414). Some embodiments provide that a block of insulating material may be provided between the solid state light emitting element and the thermally conductive post.

In some embodiments, the first and second terminals are configured to be coupled on a first side of a circuit structure. The proximal end of the thermally conductive post may be on the first side of the circuit structure and a distal end of the thermally conductive post that is opposite the proximal end may be configured to be on a second side of the circuit structure that is opposite the first side of the circuit structure. In this manner, electrical terminations may be provided on the first side of the circuit structure and heat may be transferred to the second side of the circuit structure via the thermally conductive post. By separating the electrical and thermal management functions, conventional circuit structures may be used without modifications to the electrical connection features.

Some embodiments provide that the electrically insulating submount is configured to be mounted on a first side of a circuit structure that includes conductive portions that are configured to conductively engage the first and second terminals. In some embodiments, a distal end of the thermally conductive post is configured to extend through the circuit structure to transfer thermal energy that is generated by the solid state light emitting element to the second side of the circuit substrate. The distal end of the thermally conductive post may be configured to be attached to a thermal dissipation component and/or material that is on the second side of the circuit structure.

Some embodiments include providing a reflective component that is proximate the solid state light emitting element (block 416). The reflective component may include at least one reflective surface that is configured to reflect light that is emitted from the solid state light emitting element.

Figure 6:
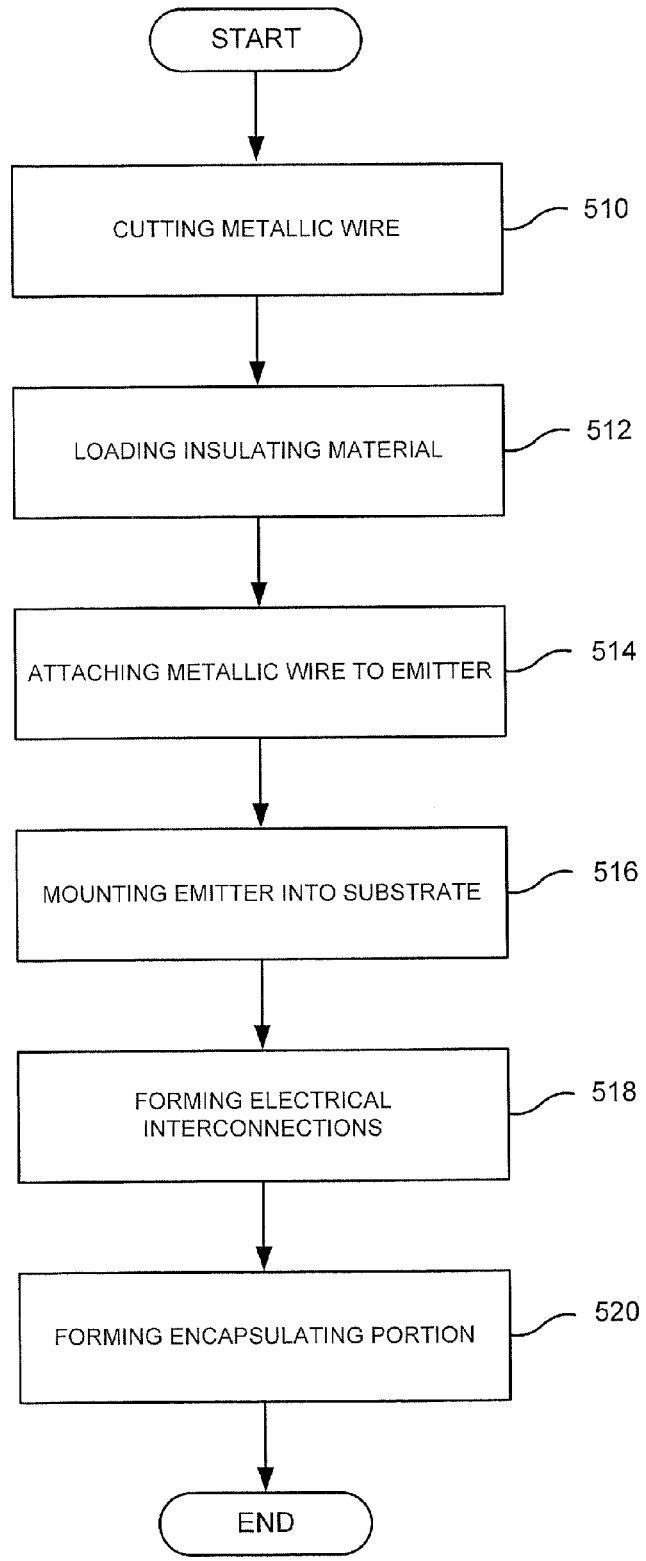
FIG. 6 is a block diagram illustrating operations for assembling a light emitting apparatus according to some embodiments of the invention.

Reference is now made to FIG. 6, which is a block diagram illustrating operations for assembling a light emitting apparatus according to some embodiments of the invention. A metallic wire is cut to length (block 510). The metallic wire may be cut to a length that corresponds to a cross-sectional dimension of each of a circuit structure, a substrate and/or a thermal dissipation material. Some embodiments provide that the metallic wire may include a square, rectangular, circular, X-shaped and/or H-shaped cross-sectional shape. In some embodiments, a cold heading process may be performed on one end of the metallic wire to form a head portion.

Electrically insulating material may be loaded into a manufacturing fixture for attaching a solid state light emitting element to the metallic wire (block 512). The electrically insulating material may be provided between the solid state light emitting element and the metallic wire and may be a separate structure and/or a layer therebetween. A proximal end of the metallic wire may be attached to the solid state light emitting element to generate an emitter assembly (block 514).

The emitter assembly may be mounted into an insulating substrate such that the proximal end of the wire corresponds to a first side of the insulating substrate and a distal end that is opposite the proximal end corresponds to a second side of the insulating substrate that is opposite the first side of the insulating substrate (block 516). Some embodiments provide that the substrate may include a ceramic substrate and that surface mount technology may be used to form interconnections between the insulating substrate and a circuit structure on which the insulating substrate is mounted. In some embodiments, the insulating substrate may include a leadframe substrate. Electrical interconnections may be formed from the solid state light emitting element to electrical terminals on the first side of the insulating substrate (block 518). An encapsulating portion may be formed over a portion of the emitter assembly that corresponds to the first side of the insulating substrate (block 520).

Once the insulating substrate is attached to a first side of a circuit structure, the distal end of the metallic wire may extend through the circuit structure and to a second side of the circuit structure. While the electrical connections may be provided solely on the first side, the metallic wire may transfer heat that is generated by the solid state light emitting element to the second side of the circuit structure.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of packaging a solid state light emitting element, the method comprising:

mounting, to a thermally conductive component, a solid state light emitting element that includes first and second electrical connection points that are configured to be conductively engaged on a first side of a circuit structure;

electrically insulating the solid state light emitting element from the thermally conductive component to provide that electrical connections are arranged on the first side of the circuit structure and heat is conducted to a second side of the circuit structure that is opposite the first side of the circuit structure; and engaging a distal end of the thermally conductive component with a heat dissipating component that is positioned on the second side of the circuit structure.

2. The method according to claim 1, further comprising providing surface mount technology (SMT) contacts corresponding to the first and second electrical connection points that are configured to conductively engage mating contacts of the first side of the circuit structure.

3. A light emitting apparatus, comprising:

a solid state light emitting element including first and second electrically conducting emitter connection portions across which a voltage may be applied to activate the solid state light emitting element and that are configured to be electrically coupled to electrical termination surfaces on a first side of a circuit structure;

a thermally conductive post that is configured to conduct heat generated by the solid state light emitting element from a proximal end that is proximate the solid state light emitting element on the first side of the circuit structure to a distal end that is on a second side of the circuit structure that is opposite the first side of the circuit structure; and an electrically insulating layer between the proximate end of the thermally conductive post and the solid state light emitting element, wherein the thermally conductive post is configured to extend through the circuit structure and to be received by a heat dissipating component.

4. The apparatus according to claim 3, wherein the thermally conductive post is configured to engage the heat dissipating component via solder, an adhesive compound, a thermal grease, friction and/or a mechanical compression fastening technique.

5. The apparatus according to claim 3, wherein the thermally conductive post comprises:

a head portion corresponding to the proximal end and that includes a first diameter; and a shaft portion that includes the distal end and that includes a second diameter that is less than the first diameter.

6. The apparatus according to claim 3, wherein the distal end of the thermally conductive post comprises a tapered portion that is configured to form a pointed end.

7. The apparatus according to claim 3, further comprising:
an electrically insulating submount that is configured to engage the proximal end of the thermally conductive post; and
a plurality of electrically conducting components on the electrically insulating submount that are configured to conductively couple the first and second electrically conducting emitter connection portions with respective conductive portions on the first side of the circuit structure.

8. The apparatus according to claim 7, wherein the electrically insulating submount comprises a ceramic material.

9. The apparatus according to claim 3, wherein the solid state light emitting element comprises a reflective portion including at least one reflective surface that is operable to reflect light emitted from the solid state light emitting element.

10. A method of assembling a light emitting apparatus comprising:
mounting a solid state light emitting element on a proximal end of a thermally conductive post that is configured to be adjacent a first side of an electrically insulating submount that includes a hole that is configured to receive the thermally conductive post; and
electrically connecting first and second electrical contacts of the solid state light emitting element to first and second terminals on the first side of the electrically insulating submount that includes a second side that is opposite the first side and through which the thermally conductive post protrudes to transfer heat from the first side of the electrically insulating submount to the second side of the electrically insulating submount; and
electrically insulating the solid state light emitting element from the thermally conductive post by forming a dielectric layer on a top surface of the thermally conductive post.

11. The method according to claim 10, wherein first and second terminals are configured to be conductively coupled on a first side of a circuit structure,
wherein the proximal end of the thermally conductive post is on the first side of the circuit structure, and
wherein a distal end of the thermally conductive post that is opposite the proximal end of the thermally conductive post is configured to be on a second side of the circuit structure that is opposite the first side of the circuit structure to transfer heat from therefrom.

12. The method according to claim 10,
wherein the electrically insulating submount is configured to be mounted on a circuit structure that includes a first side that includes conductive portions that are configured to conductively engage the first and second terminals, and
wherein a distal end of the thermally conductive post that is opposite the proximal end is configured to extend through the circuit structure to transfer thermal energy that is generated by the solid state light emitting element to a second side of the circuit structure that is opposite the first side of the circuit structure.

13. The method according to claim 12, wherein the distal end of the thermally conductive post is further configured to be attached to a thermal dissipation component on the second side of the circuit structure and that is configured to dissipate the thermal energy received from the thermally conductive post.

14. The method according to claim 10, further comprising providing a reflective component that is proximate the solid state light emitting element and including at least one reflective surface that is operable to reflect light emitted from the solid state light emitting element.

15. The method according to claim 10, wherein electrically insulating submount includes ceramic material.

16. The method according to claim 10, wherein the electrically insulating submount includes surface mount technology (SMT) contacts corresponding to the first and second electrical connection points that are configured to conductively engage mating contacts of a first side of a circuit structure.

17. The method according to claim 10, wherein the thermally conductive post includes a distal end that is opposite the proximal end and that includes a tapered portion that is configured to form a pointed end.

* * * * *